(12) United States Patent
Inoue et al.

(10) Patent No.: US 6,384,898 B1
(45) Date of Patent: May 7, 2002

(54) PROJECTION EXPOSURE APPARATUS

(75) Inventors: Jiro Inoue, Kanagawa-ken; Kazuaki Suzuki, Tokyo, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/722,310

(22) Filed: Nov. 28, 2000

Related U.S. Application Data

(63) Continuation of application No. 09/437,228, filed on Nov. 10, 1999, now abandoned, which is a continuation of application No. 09/018,943, filed on Feb. 5, 1998, now abandoned.

(30) Foreign Application Priority Data

Feb. 6, 1997  (JP) .............................................. 9-38328
Apr. 3, 1997  (JP) .............................................. 9-85152

(51) Int. Cl.[7] ........................ G03B 27/42; G03B 27/54; G03B 27/32
(52) U.S. Cl. .............................. 355/53; 355/67; 355/77
(58) Field of Search ........................ 355/53, 55, 67–71, 355/77; 356/399–401; 250/548, 205

(56) References Cited

U.S. PATENT DOCUMENTS

| 4,550,374 A | 10/1985 | Meshman et al. .......... 364/490 |
| 4,853,745 A | 8/1989 | Kamiya et al. ............... 355/43 |
| 5,053,614 A | * 10/1991 | Yui et al. .................... 250/205 |
| 5,148,214 A | 9/1992 | Ohta et al. .................... 355/43 |
| 5,160,957 A | 11/1992 | Ina et al. ...................... 355/43 |
| 5,309,197 A | 5/1994 | Mori et al. .................... 355/53 |
| 5,347,118 A | 9/1994 | Iwanaga ...................... 250/205 |
| 5,569,930 A | 10/1996 | Imai ......................... 250/559.4 |
| 5,591,958 A | 1/1997 | Nishi et al. .................. 250/205 |
| 5,682,243 A | 10/1997 | Nishi .......................... 356/401 |
| 5,703,685 A | 12/1997 | Senda et al. ................. 356/401 |
| 5,721,608 A | 2/1998 | Taniguchi .................... 355/53 |
| 5,796,467 A | 8/1998 | Suzuki ........................ 355/53 |

FOREIGN PATENT DOCUMENTS

JP           07-095508           10/1988

* cited by examiner

Primary Examiner—Russell Adams
Assistant Examiner—Hung Henry Nguyen
(74) Attorney, Agent, or Firm—Armstrong, Westerman & Hattori, LLP

(57) ABSTRACT

Light from an alignment illumination system having a flash lamp is bent by a beam splitter to be illuminated onto an alignment mark on a wafer through a microscope optical system. An alignment signal treatment system reads output values from wafer stage interfermoters at the same time the flashing light is emitted from the flash lamp of the alignment illumination system. Since an image of the alignment mark focused on an imaging element is generated only when the flashing light is emitted, X, Y coordinate values representing a position of a wafer stage upon emission of the flashing light indicate X, Y coordinate values of the position of the wafer stage at the time when the image of the alignment mark is measured by the imaging element. An imaging element such as a CCD images a wafer alignment mark multiple times in synchronization with emission of pulse light while shifting a wafer stage. A plurality of image data are sampled and stored. A position of the wafer stage upon emission of the pulse light is measured by interferometers and stored. When the plurality of image data are added, a shift amount of the wafer stage is taken into consideration. For example, if the shift amount of the wafer stage within a time period between two successive light emissions corresponds to two pixels, the image data are deviated by two pixels. The signal may also be deviated by interpolation calculation.

36 Claims, 6 Drawing Sheets

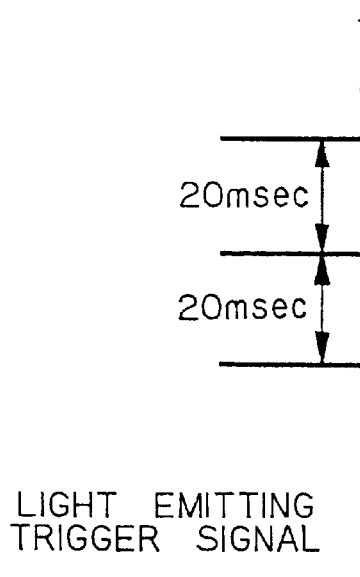
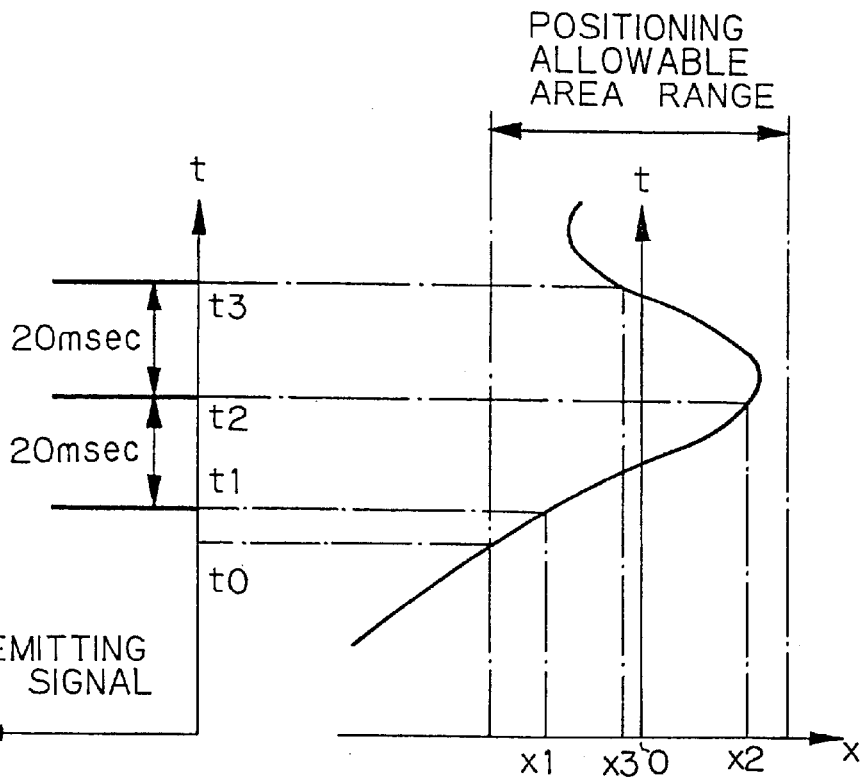
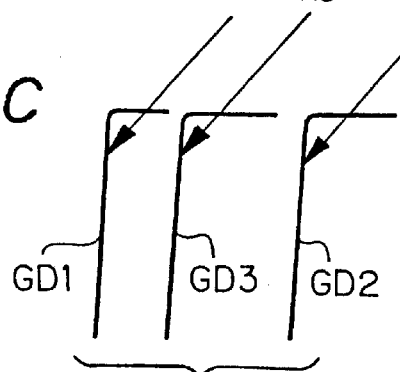
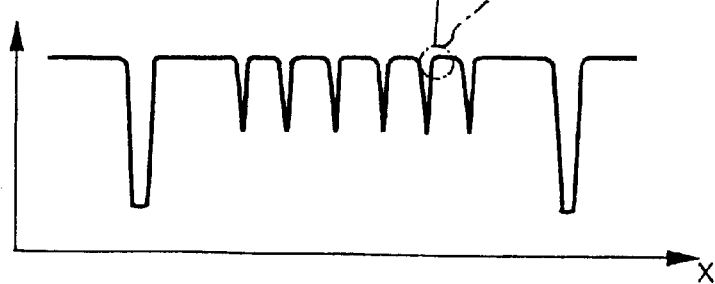
Fig. 6A
Fig. 6B
POSITIONING ALLOWABLE AREA RANGE
Fig. 6C
Fig. 6D
SIGNAL LEVEL FOR RESPECTIVE PULSES

PROJECTION EXPOSURE APPARATUS

This application is a Continuation of prior application Ser. No. 09/437,228, filed Nov. 10, 1999, now abandoned which is a continuation of prior application Ser. No. 09/018,943, filed Feb. 5, 1998 now abandoned.

BACKGROUND OF THE INVENTION

The present invention relates to a projection exposure apparatus used in a photo-lithographic process to manufacture a semi-conductor device or a liquid crystal display device, and apparatus and method for detecting a mark position.

In a photo-lithographic process of a projection exposure apparatus for manufacturing a semi-conductor device or a liquid crystal display device, there has been used an exposure apparatus in which an image of a photo-mask or a reticle (referred to as "reticle" hereinafter) on which a transfer pattern is formed is transferred onto a semiconductor wafer on which photosensitive material such as photo-resist is coated or a photosensitive substrate such as a glass substrate (referred to as "wafer" hereinafter) by using a projection exposure method or a proximity exposure method. In such an exposure apparatus, since an image of a circuit pattern on the reticle must be overlapped with a circuit pattern already formed on the wafer with high accuracy, prior to exposure, positional alignment between the reticle and the wafer (referred to as "alignment" hereinafter) should be performed. The exposure apparatus performs the alignment by correctly detecting a position of each positioning mark (referred to as "alignment mark" hereinafter) formed on the wafer as well as a position of the circuit pattern in the previous process.

There are the following alignment systems. In an LSA (laser-step-alignment) system, as shown in U.S. Pat. No. 5,151,750, laser light flux is illuminated on a grid-shaped alignment mark and the position of the alignment mark is detected on the basis of change in intensity of reflected light. In an LIA (laser interference alignment) system, as shown in U.S. Pat. No. 5,151,750, coherent light fluxes are incident on a grid-shaped alignment mark from two symmetrical order directions (for example, +first-order diffraction light direction and –first-order diffraction light direction) and the position and positional deviation (in a pitch direction) of the grid mark by interfering two diffraction light components generated from the grid mark along the same direction. Further, in an FIA (field-image-alignment) system, as shown in U.S. Pat. No. 5,493,403, in a condition that a wafer stage is stopped, white light is illuminated onto an alignment mark on the wafer, and an image of the alignment mark so obtained is detected by an imaging element, the position of the alignment mark is detected by effecting image treatment process.

There are the following alignment optical systems used with such alignment systems. In a TTL (through-the lens) system, a projection optical system is used as a detection optical system and the alignment mark on the wafer is detected by the projection optical system. In a TTR (through-the-reticle) system, a reticle alignment mark provided on the reticle and the alignment mark on the wafer are simultaneously observed (detected) through a projection optical system. In an off-axis system, there is provided an exclusive optical system having an optical axis spaced apart from an optical axis of a projection optical system by a predetermined distance, the alignment mark on the wafer is observed (detected) while illuminating white light from an exclusive light source on the alignment mark.

In the past, since a wafer stage on which the wafer to be moved is rested has a predetermined positional relation to a wafer stage guide through roller bearings and is position-controlled by a rotating motor and an associated ball screw, so long as the motor is stopped, the wafer stage could easily be maintained in the stopped condition. Recently, as a so-called scan type projection exposure apparatus in which a reticle stage on which the reticle is rested and the wafer stage are scanned to perform exposure in a synchronous manner has been developed, since high speed driving and minute control of the wafer stage are required, a so-called air stage of complete non-contact type in which the stage is floated by air pressure and is driven by a linear motor of non-contact type has been used. Although the air stage is superior to the conventional stages in various points such as a moving speed, dynamic control and the like, since it is a complete non-contact type, when observed microscopically, it is difficult to maintain the stage in the stopped condition.

In the projection exposure apparatus in which the air stage of complete non-contact type which is always moved microscopically is used as the wafer stage, for example, if the alignment is effected by using the off-axis alignment optical system in the FIA system, the following problems will occur.

In the image treatment alignment using the conventional white light source, since a predetermined integrated exposure amount must be provided to an imaging element used for picking-up the image, emission of the white light illuminated onto the alignment mark on the wafer must be continued for a predetermined time period. Accordingly, during the emission of the white light, the wafer stage on which the wafer is rested must be kept stationary. If the position of the wafer stage is shifted during the emission of the light for giving the integrated exposure amount required for the imaging element, accuracy of detection of the position of the alignment mark will be worsened.

However, in the air stage of complete non-contact type as mentioned above, since it is difficult to keep the stage stationary, the position of the air stage may be minutely changed while the imaging element of the alignment optical system is picking-up the image of the alignment mark, with the result that the accuracy of detection of the position of the alignment mark will be worsened, thereby making the high accurate alignment impossible.

Although it is considered that the air stage is mechanically stopped during the detection of the alignment mark by using any fixing mechanism, this attempt is not preferable because mechanical stress is applied to the air stage whenever the air stage is forcibly stopped and an excessive time period is required for driving the fixing mechanism to fix the air stage, resulting in reduction of through-put. If a white light source of continuous emission type having illuminance capable of obtaining the required integrated exposure amount of the imaging element for so short time period so that the shift of the position of the air stage is negligible, a heat amount generating from the white light source would be considerably increased, with the result that heat shield of the exposure apparatus is made difficult.

As another related technique, in a mark position detecting apparatus of image focusing type used in such an exposure apparatus, both an image of pinch marks disposed side by side at a predetermined interval (i.e., index pattern) formed on the reticle and an image of an alignment mark (for example, line-and-space mark) on the photosensitive substrate such as a wafer or a glass substrate are focused onto an imaging element through a projection optical system a focusing optical system, whereby a position of the photosensitive substrate is detected on the basis of image data from the imaging element. Further, it is also known to provide a mark position detecting apparatus in which an index plate having a substantially conjugate relation to a wafer is provided within an alignment optical system via an objective optical system different from a projection optical system, and both an image of an index pattern on the index plate and an image of the wafer alignment mark are focused onto an imaging element through a focusing optical system, and a position of the photosensitive substrate is detected on the basis of image data from the imaging element. In such position detecting apparatuses, the index pattern and the alignment mark are imaged (or photo-taken) by several times to obtain a plurality of images, and these plural images are averaged to improve measuring accuracy.

However, When the image data from the imaging element is obtained, in order to improve SN of the image, image accumulation time of the order of 10 msec is required. During this time period, if the wafer stage is minutely shifted, the mark image would become obscure. Thus, in the related position detecting apparatuses, before the image data is obtained, the wafer stage is positioned at a predetermined position accurately within an error range of several nm~10 nm, and, after the wafer stage is completely stopped, the image data is obtained. Therefore, the time period for positioning the stage prior to the alignment is increased, thereby reducing the through-put. Further, when the averaging treatment is effected by using the several images, if the image data are merely added to each other, the composite mark image after addition would become obscure in dependence upon the shift (or positional deviation) of the wafer stage during the acquirement of the image data.

A first object of the present invention is to provide a projection exposure apparatus in which alignment can be effected with high accuracy by using a light source emitting white flashing light as detection light of an alignment system even when a position of a wafer stage is shifted microscopically.

A second object of the present invention is to provide mark position detecting apparatus and method, in which an alignment mark is imaged while a substrate stage is being shifted, and averaging treatment is effected to prevent obscure (or blurred) image.

SUMMARY OF THE INVENTION

To achieve the above first object, according to the present invention, there is provided a projection exposure apparatus comprising a projection optical system PL which projects an image of a pattern on a reticle illuminated by exposure light onto a photosensitive substrate, a substrate stage WST which shifts the photosensitive substrate W in a plane perpendicular to an optical axis of the projection optical system, a stage position measuring system WST1, WST2 which measures a shift amount of the substrate stage, and an alignment system 1 which illuminates detection light onto an alignment mark AM provided on the photosensitive substrate and receives reflected light reflected from the alignment mark to detect a position of the alignment mark, and wherein the alignment system has a light source 2 emitting white flashing light.

Preferably, a timing for emitting the flashing light is in synchronous with a measuring timing of the stage position measuring system.

Preferably, the flashing light is emitted by several times, and respective positions of the substrate stage upon emission of the respective flashing lights are measured by the stage position measuring system, and a plurality of detected images of the alignment mark are averaged.

According to the present invention, a required integrated exposure amount can be given to an imaging element of an image treating alignment system within a light emitting time period of the flashing light from the light source, and, since the light emitting time period of the flashing light is very short, a shift amount of the wafer stage within the light emitting time is negligible. That is to say, by the control at an alignment signal treating system, a light emitting timing of the flashing light of the flash lamp (light source) is in synchronous. with a measuring timing of a wafer stage interferometer so that the taking-in of the alignment mark and the position measurement of the wafer stage are effected simultaneously, with the result that, even if the position of the wafer stage is shifted microscopically, high accurate alignment can easily be effected.

To achieve the above second object, according to the present invention, there is provided a mark position detecting apparatus comprising a position detecting illumination system 205 which illuminates pulse light onto an alignment mark WM1 on a substrate W, an imaging element S1 which images the alignment mark WM1 in synchronous with emission of the pulse light, a position detecting system 107 which reads a position of a substrate stage 105 upon the imaging by the imaging element, a position memory system 300 which stores the position of the stage 105 read by the position detecting system 107, and an image memory system 300 which stores image data imaged by the imaging element S1.

Preferably, there is provided an image composing system which forms a composite image on the basis of the image data stored in the image memory system 300 and the position data corresponding to the plurality of image data stored in the position memory system 300.

Further, preferably, when the signals of respective pixels of the imaging element S1 are added to each other with respect to the plurality of image data, the image composing system corrects the signals of respective pixels by shift amounts of the stage 105 detected by the position detecting system 107 at respective imaging points and then are added.

Further, preferably, the mark WM1 is imaged by plural times while shifting the stage 105.

Further, to achieve the above second object, according to the present invention, there is provided a mark position detecting method comprising an illuminating step for illuminating pulse light onto an alignment mark on a substrate W, an imaging step for imaging the alignment mark in synchronous with emission of the pulse light, a position detecting step for reading a position of a substrate stage at the imaging point, a position storing step for storing the position of the stage read by the position detecting step, and an image storing step for storing image data so imaged.

Preferably, there is added an image comprising a step for forming a composite image on the basis of the image data stored in the image storing step and the position data corresponding to the plurality of image data stored in the position storing step.

Further, preferably, when the signals of respective pixels of the imaging element S1 are added to each other with respect to the plurality of image data, the signals of respective pixels are corrected by shift amounts of the stage 105 detected at respective imaging points and then are added.

Further, preferably, the mark is imaged by plural times in synchronous with the pulse light while shifting the stage 105.

According to the above-mentioned apparatus and method, since the position detecting light source of pulse generating type is used, it can be assumed that the stage is substantially stopped within the pulse generating time period, and, thus, even when the mark is imaged while the stage is not completely stopped, the mark image does not become blur. Particularly, when the images are added (or composed) on the basis of the plurality of pulses, since the positional deviation of the stage at each imaging point is corrected, the composite mark image (i. e., added mark images) does not become blur. In addition, when the position is detected, since the accurate positioning is not required, after rough positioning is effected, even if the wafer stage is minutely shifted, the image data can be obtained, with the result that the total alignment time can be reduced, thereby improving the through-put. That is to say, according to the present invention, even when the mark is imaged by plural times to improve the alignment accuracy, desired through-put and desired accuracy can be achieved.

BRIEF DESCRIPTION OF THE DRAWINGS

FIG. 6A is a view showing a light emitting trigger signal,

FIG. 6B is a view showing shift in position of a wafer stage,

FIG. 6C is an enlarged view showing "a" portion of FIG. 6D and showing edge portions of a pulse image signal, and FIG. 6D is a view showing the pulse image signal.

DETAILED DESCRIPTION OF PREFERRED EMBODIMENTS

Figure 2:
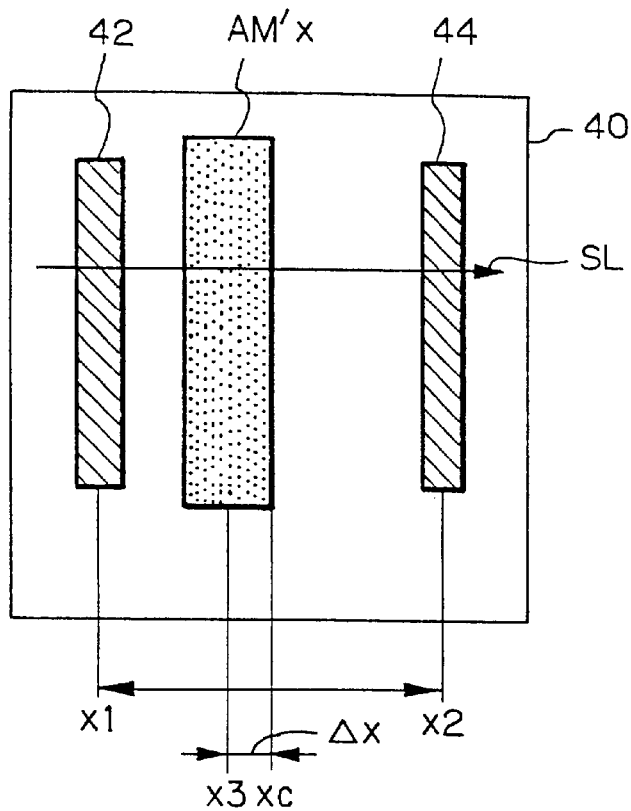
FIG. 2 is a view showing detection of an alignment error by using alignment marks.
Figure 3:
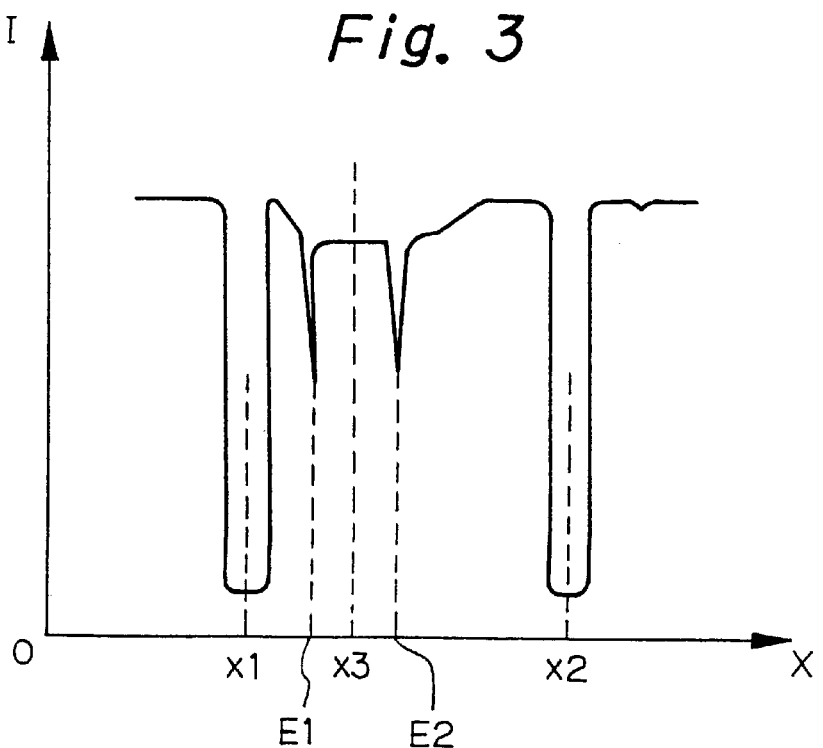
FIG. 3 is a view showing a wave form of an alignment signal.

A projection exposure apparatus according to a preferred embodiment of the present invention will be explained with reference to FIGS. 1 to 3.

The projection exposure apparatus according to this embodiment is a projection exposure apparatus of step-and-repeat type in which an image of a pattern on a reticle is reduction-projected through a projection optical system, and the pattern image on a reticle is successively exposed onto shot areas on a photosensitive substrate.

Figure 1:
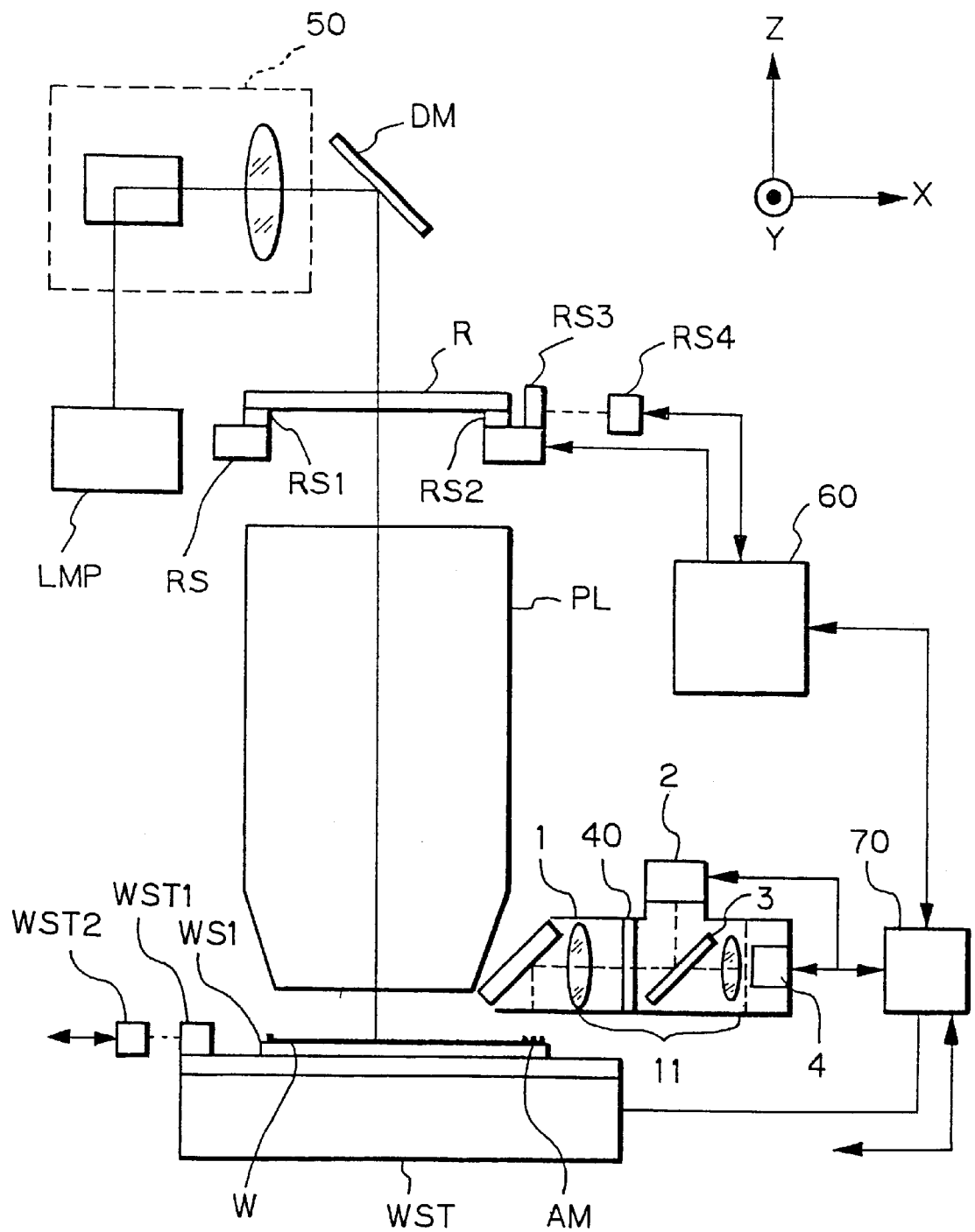
FIG. 1 is a schematic constructural view of a projection exposure apparatus according to a preferred embodiment of the present invention.

FIG. 1 schematically shows a construction of the projection exposure apparatus according to this embodiment. In this specification, a direction of an optical axis of a projection optical system PL is referred to as a Z-axis, and a plane perpendicular to the optical axis is referred to as an XY plane.

As illumination light IL from an exposure illumination light source LMP, for example, i-ray (having a wave length $\lambda$ of 365 nm) or g-ray ($\lambda$=436 nm) which are bright-lines from a super high pressure mercury lamp, or KrF excimer laser light ($\lambda$=248 nm), ArF excimer laser light, or ultraviolet light such as metal vapor laser can be used. In the illustrated embodiment, the i-ray which is a brightline from the super high pressure mercury lamp is used as the illumination light IL.

The illumination light IL emitted from the illumination light source LMP is converted into a parallel light flux having substantially uniform illuminance distribution by means of an illumination optical system 50 comprised of a collimeter lens, a fly-eye lens and a reticle blind, and then is sent to a dichroic mirror DM. The illumination light IL is bent at a substantially right angle by the dichroic mirror DM to illuminate a reticle R with uniform illuminance distribution.

On a pattern forming area on the reticle R, a circuit pattern to be projected onto a wafer (substrate to be exposed) W is formed by means of an electron beam image forming device and the like. The circuit pattern on the reticle R is projected and exposed onto the wafer W by illuminating the illumination light flux bent toward a downward vertical direction by means of the dichroic mirror DM disposed above the reticle R.

The reticle R is secured onto a reticle stage (mask protecting mechanism) RS via reticle chucks RS1, RS2 provided on the reticle stage RS by vacuum absorption, for example. A position of the reticle stage RS in an X direction is always measured by means of a reticle stage interferometer for effecting measurement by reflecting laser light from a laser interferometer RS3 onto a reflection mirror RS4 disposed around the reticle stage RS, and a position of the reticle stage RS in a Y direction is also always measured by means of a similar reticle stage interferometer (not shown). Measurement signals from these reticle stage interferometers RS3 are sent to a control system 60. The control system 60 controls shift amounts of the reticle stage RS in the X, Y directions correctly on the basis of the measurement signals, thereby positioning the reticle R at a predetermined position.

The projection optical system PL serves to collect the light flux which has passed through the reticle R and to project the pattern image of the reticle R onto a predetermined shot position on the wafer W rested on a wafer holder WS1 provided on a wafer stage WST which can be shifted in the X, Y directions. The wafer holder WS1 holds the wafer W by vacuum absorption and can be shifted in a Z direction to adjust a distance between a surface of the wafer W and the projection optical system PL, thereby aligning the surface of the wafer W with a focusing plane of the projection optical system PL. A width of a projected image is reduced in comparison with a width of the pattern of the reticle R, for example, by ⅕.

A shift amount of the wafer stage WST is measured by wafer stage interferometers for effecting measurement by reflecting laser lights from laser interferometers WST2 onto reflection mirrors WST1 fixed to the stage in the X, Y directions. In FIG. 1, the reflection mirror and the laser interferometer for measuring the shift amount in the Y direction are not shown. By driving the wafer stage WST in a step-and-repeat manner while measuring the shift amount of the wafer stage WST correctly by means of the laser interferometers WST2, the image of the circuit pattern of the reticle R is successively overlap-exposed with respect to a predetermined number of shot positions on the wafer W rested on the wafer stage WST.

The position of the wafer stage WST in the XY plane is always detected by the wafer stage interferometers provided in the X,Y directions, and measurement signals from these wafer stage interferometers are sent to the control system 60. The control system 60 controls shift amounts of the wafer stage WST in the X, Y directions correctly on the basis of the measurement signals, thereby positioning the wafer W at a predetermined position.

When the circuit pattern of the reticle R is exposed onto the wafer W, the wafer W must previously be aligned with respect to the reticle R. To this end, alignment marks AM are originally formed on the wafer W. Normally, although a plurality of alignment marks AM are formed on the wafer W, in the illustrated embodiment, the alignment mark AM as shown in FIG. 1 is represented.

An alignment microscope 1 of off-axis type for image treatment type alignment is disposed on one side of the projection optical system PL at a position where the microscope does not shield the projecting plane of the projection optical system PL. Now, a construction of the alignment microscope 1 will be briefly described. An alignment illumination system 2 having a flash lamp as a light source is used to illuminate the alignment marks AM on the wafer W. Light from the alignment illumination system 2 is bent by a beam splitter to reach a microscope optical system 11 and is illuminated onto the alignment mark AM on the wafer W through the microscope optical system 11.

A wavelength zone of the flash lamp (light source) of the alignment illumination system 2 is selected by a wavelength selection filter (not shown) provided in a light path of the alignment illumination system 2 so that the wavelength zone differs from a photosensitive wavelength zone of photosensitive material coated on the wafer W and has a wavelength zone width of about 200 nm, for example. An emitting time period of the flash lamp is normally about 1 msec. Thus, by using the flash lamp as the light source, an integrated exposure amount required for an imaging element 4 can be sufficiently obtained within the light emitting time period of the flashing light and excessive heat can be prevented from being generated from the light source.

A light amount of the flash lamp (light source) of the alignment illumination system 2 is calculated by an alignment signal treatment system 70 on the basis of a light amount detected by the imaging element 4 so that the light amount of the flash lamp is controlled to an optimum value.

Since the light emitting time period of the flash lamp is very short as mentioned above, it is assumed that the wafer stage WST is kept stationary within the light emitting time period of the flash lamp.

The alignment signal treatment system 70 reads output value of the wafer stage interferometers comprised of the reflection mirrors WST1 and the laser interferometers WST2 at the same time, in the instant when the flashing light is emitted from the flash lamp of the alignment illumination system 2. The alignment signal treatment system 70 calculates X, Y coordinate values representative of the position of the wafer stage WST upon emission of the flashing light on the basis of the read-out output values.

The flashing light emitted from the flash lamp of the alignment illumination system 2 is illuminated onto the alignment mark AM on the wafer W, and a reflected light, i.e., light flux forming the image of the alignment mark AM is returned through the light path of the microscope optical system 11 and is focused on the imaging element 4 through the beam splitter 3.

Since the image of the alignment mark AM focused on the imaging element 4 is generated only in the instant when the flashing light is emitted from the flash lamp, the X, Y coordinate values (representative of the position of the wafer stage WST upon emission of the flashing light) calculated by the alignment signal treatment system 70 indicates X, Y coordinate values of the position of the wafer stage WST upon measurement of the image of the alignment mark AM by means of the imaging element 4.

An index plate 40 made of glass or the like is disposed within the microscope optical system 11, and the imaging element 4 serves to image or pick up both an index marks formed on the index plate 40 and the alignment mark AM simultaneously. Now, an example of an image picked up by the imaging element 4 will be explained with reference to FIG. 2. In FIG. 2, an example that only an alignment mark AMx in the X direction (X direction alignment mark) on the wafer W is detected will be described. The two index marks 42, 44 made of chrome or the like are formed on the index plate 40 formed from a glass plate and are arranged so that an enlarged image of the alignment mark AMx on the wafer W are pinched between the two index marks. FIG. 2 shows an example that both the index plate 40 and the image of the alignment mark AMx are displayed on a display device. When the wafer W is positioned so that the image AM'x of the alignment mark AM is positioned between the index marks 42 and 44, it is assumed that a central position X3 of the the image AM'x of the alignment mark is deviated from a central position Xc between the index marks 42, 44 in the X direction by an amount of ΔX in the X direction. This deviation amount ΔX is a so-called alignment error. The central position Xc is a just middle position between a center X1 of the mark 42 and a center X2 of the mark 44.

The image signal imaged by the imaging element 4 is sent to the alignment signal treatment system 70, where the deviation amount ΔX between the index marks 42, 44 and the alignment mark AM is calculated in the following manner. An image signal at a scan line SL positioned within a predetermined scan area regarding the images shown in FIG. 2 has a wave form as shown in FIG. 3. In FIG. 3, the ordinate indicates magnitude I of the image signal and the abscissa indicates a position X. Since the index plate 40 is illuminated by the reflection light from the wafer W, in the positions X1, X2, the magnitude I of the output signal becomes minimum (bottom) due to the presence of the index marks 42, 44. Regarding the alignment mark AMx, since the light is scattered at two step edges extending in parallel along a direction perpendicular to the scan line SL, at positions E1, E2, the magnitude I of the output signal becomes minimum (bottom). Since the position X3 is detected as the middle position between the positions E1 and E2 and the position Xc is detected as the middle position between the positions X1 and X2, the alignment error is represented by the following equation:

$$\Delta X = (X1+X2)/2 - (E1+E2)/2$$

As mentioned above, since the timing for emitting the flashing light from the flash lamp is in synchronous with the measuring timing of the wafer stage interferometers, when the wafer stage WST is shifted from the position of the wafer stage WST calculated by the alignment signal treatment system 70 by an amount of −ΔX, the alignment in the X direction can be achieved.

In this way, according to the illustrated embodiment, the integrated exposure amount of the image treatment alignment system required for the imaging element 4 can be provided within the flashing light emitting time period of the light source, and, since the light emitting time period of the flashing light is very short, the change in position (i.e., shift amount) of the wafer stage within the light emitting time period is negligible. That is to say, by the control in the alignment signal treatment system 70, the flashing light emitting timing of the flash lamp is in synchronous with the measuring timing of the wafer stage interferometers so that the imaging operation of the alignment mark and the position measurement of the wafer stage WST are effected simultaneously, with the result that the high accurate alignment can easily be achieved even if the position of the wafer stage is changed microscopically.

The present invention is not limited to the above-mentioned embodiment, but various alterations can be made.

For example, in the above-mentioned embodiment, while an example that the image is picked up by the imaging element 4 upon emission of one flash light was explained, a plurality images may be picked up while the flashing light is emitted by plural times. Also in this case, since the position of the wafer stage WST upon emission of each flashing light is detected by the wafer stage interferometers, the change in position of the wafer stage WST generated between the plurality of picked up images can easily be cancelled by simple calculation in the alignment signal treatment system 70.

When the accuracy of the alignment is to be improved by picking up the plurality of images in this way and by averaging the plural images, every time the image is picked up by the imaging element 4, both the emission of the flashing light and the reading of the output values of the wafer stage interferometers are effected simultaneously, and the position of the alignment mark AM is calculated by using the X, Y coordinate values of the wafer stage WST upon each picking up of the image.

In a so-called excimer stepper having an excimer laser as an exposure light source which will be supposed to be mainly used as from now, chemical amplification type resist having a photosensitive wave length zone of 400 nmm or less will be used as photosensitive material coated on the wafer. Accordingly, since the limitation of the wavelength selection range of the light emission wavelength zone of the flash lamp is relaxed so that the light amount of the flashing light can be increased by using a wider wavelength zone. Therefore, a more compact flash lamp can be used in comparison with the flash lamp according to the illustrated embodiment in which the normal type resist (having photosensitive wavelength zone of about 500 nm or less) is used as the photosensitive material.

In the above-mentioned embodiment, an example that the present invention is applied to the projection exposure apparatus of so-called stepper type in which the the exposure is effected while both the reticle R and the wafer W being kept stationary was explained, the present invention can be applied to a scan type projection exposure apparatus of step-and-scan system in which a part of the pattern of the reticle R is projected on the wafer W through a projection optical system, and, by scanning both the reticle R and the wafer W in a synchronous manner, the pattern of the reticle R is successively exposed onto the wafer W.

As mentioned above, according to the present invention, the high accurate alignment can easily be achieved even when the position of the wafer stage is shifted microscopically.

Next, mark position detecting apparatus and method in the projection exposure apparatus will be explained with reference to FIGS. 4 to 7.

In the mark position detection apparatus according to the present invention, a discharge tube (having a flashing time period of the order of several μsec) such as a xenon lamp or a neon lamp or the like, or a pulse laser (having a pulse width of the order of several tens—several hundreds nsec) is used as a position detecting light source, the wafer mark (alignment mark) and the index pattern are imaged by several times in synchronous with pulse light while moving the wafer stage continuously, and the position of the wafer mark is detected on the basis of the plurality of images. The position of the wafer stage is detected whenever the wafer mark and the index pattern are imaged, and when the plurality of images are averaged (for example, when the images are added), by correcting the positional deviations of the wafer stage upon acquirement of respective image data and by adding the corrected data, the position of the wafer mark is detected with high accuracy.

Figure 4:
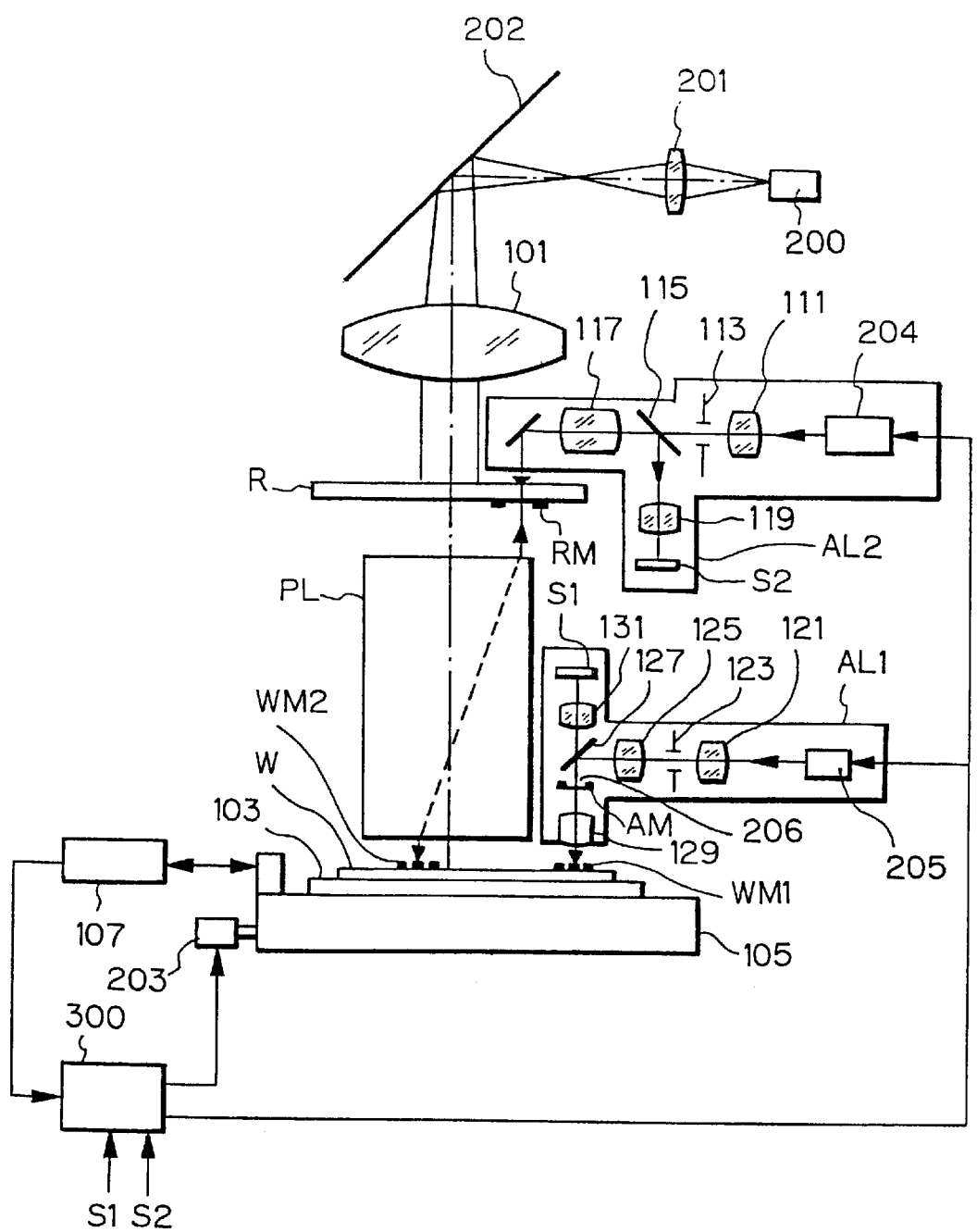
FIG. 4 is a view showing the entire construction of a projection exposure apparatus according to another embodiment of the present invention.

FIG. 4 is a constructional view showing an example of a projection exposure apparatus having the mark position detecting apparatus according to the present invention. Exposure light emitted from a light source 200 comprised of a mercury lamp or a pulse laser (for example, excimer laser) is illuminated onto a reticle R with uniform illuminance through an illumination optical system comprised of a lens system 201, a mirror 202 and a condenser lens 101. The exposure light which has passed through the reticle R is focused onto the wafer W through a projection lens PL, so that a pattern of the reticle R is transferred onto the wafer through the projection lens PL. The wafer W is rested on a wafer holder 103 provided on an XY stage 105, and the XY stage 105 can be moved two-dimensionally by a drive system 203 such as a motor. A two-dimensional position of the XY stage 105 is measured by XY stage interferometers 107, and the data from the interferometers are sent to a main control system 300. The main control system controls the drive system 203 on the basis of such data.

An alignment system AL1 of off-axis type is mounted on the projection exposure apparatus. The alignment system. AL1 of off-axis type serves to detect an alignment mark WM1 on the wafer W through an objective lens 129 different from the projection lens PL by using non-exposure light. In the alignment system AL1 of off-axis type, light from a light source 205 for emitting non-exposure pulse light is illuminated onto a field stop 123 through a relay lens 121. A light source wavelength (non-exposure light wavelength) for off-axis alignment uses visible zone—infrared zone (about 550 nm–900 nm) among spectrum of the xenon lamp or neon lamp in order to reduce interference effect due to the presence of a resist film.

The field stop 123 serves to define a visual field on the wafer W, and an image of the field stop is focused onto the wafer W through a relay lens 125, a half mirror 127, an index plate 206 and the objective lens 129. In this way, an illumination field on the wafer W is defined by the field stop 123 so that only the alignment mark WM1 and therearound on the wafer W are illuminated.

Figure 5A:
FIG. 5A is a view showing a pattern on an index plate.
Figure 5B:
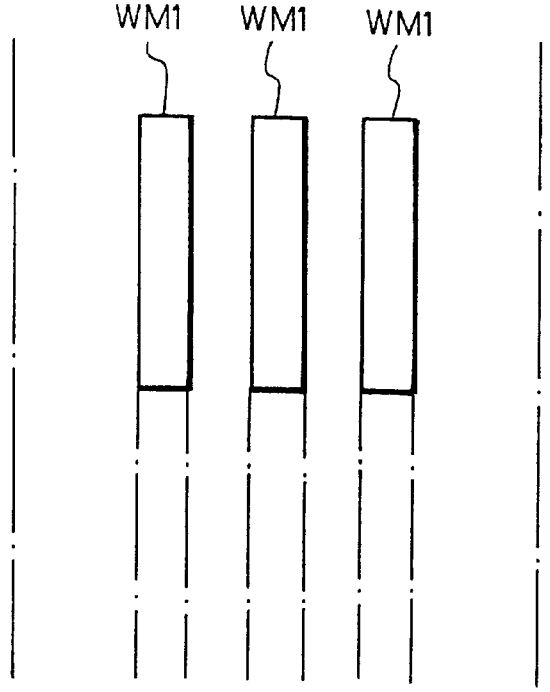
FIG. 5B is a view showing alignment marks on a wafer.

Now, a relation between the alignment mark WM1 and the index pattern (index marks AM) will be explained with reference to FIG. 5. As shown in FIG. 5A, a pair of light shield portions Cr having predetermined reflectance factor are formed on the index plate 206 made of transparent glass plate with a predetermined gap therebetween. As shown in FIG. 5B, the alignment mark WM1 is constituted by three mark portions formed in a measuring direction in a line-and-space pattern with duty ratio of 1:1.

In FIG. 4, the light returned from the alignment mark WM1 is focused onto an imaging element S1 such as a one-dimensional array sensor or a CCD through the objective lens 129, the index plate 206, the half mirror 127 and a second objective lens 131. The index plate 206 is disposed in a substantially conjugate relation to the wafer W with respect to the objective lens 129, and the second objective lens 131 serves to focus an image of the index pattern AM onto the imaging element S1. Thus, the images of the alignment mark WM1 and the index pattern AM are focused onto the imaging element S1 through the second objective lens 131.

The projection exposure apparatus shown in FIG. 4 further includes a second alignment system AL2 of TTL (through-the-reticle) type. The alignment system AL2 has a pulse light source as a light source 204. When the exposure light source is the discharge tube or the pulse laser, a part of the light can be used. When the exposure light source is a continuous light source such as the mercury lamp, the same wavelength portion is picked up from the pulse laser having the same wavelength as the exposure wavelength or from spectrum of the discharge tube such as the xenon lamp or the like. When the projection lens PL has reduced aberration for effecting sufficient achromatism regarding the wavelength of the alignment light, alignment light having a wavelength zone different from the exposure wavelength can be used.

The alignment light emitted from the light source 204 is illuminated onto a field stop 113 through a relay lens 111. As is in the off-axis system, the field stop 113 serves to define a illumination field on the wafer W, and an image of the field stop 113 is illuminated onto a reticle alignment mark RM through a half mirror 115 and an objective lens 117. Light which has passed through the reticle alignment mark RM is illuminated onto an alignment mark WM2 on the wafer W through the projection lens PL. Light reflected from the alignment mark WM2 is focused onto the reticle R through the projection lens PL again, and the images of both the wafer alignment mark WM2 and the reticle alignment mark RM are focused onto an imaging element S2 through the objective lens 117, the half mirror 115 and a relay lens 119.

Since this TTL system is fundamentally similar to the off-axis system except that the pattern AM on the index plate 206 corresponds to the reticle alignment mark RM, the off-axis system will be explained hereinbelow.

Incidentally, in the off-axis alignment, generally, since the alignment is effected by detecting the position of the alignment mark every chip (shot area) on the wafer, when the measuring ability is good, the overlapping accuracy is improved, but the exposure processing time for each wafer W becomes longer. On the other hand, in the off-axis alignment, once the alignment of the entire wafer W is completed, since the stepping of the wafer W is merely effected in accordance with chip (shot position) arrangement, the exposure processing time is shortened.

In this case, as shown in U.S. Pat. No. 4,780,617, it is also known a system in which, by adopting a so-called EGA (Enhancement Global Alignment) which is shown in U.S. Pat. No. 4,780,617, the position detection is effected regarding selected plural alignment marks on the single wafer W and the positional error between the actual position and the design position is calculated. When the wafer is actually moved steppingly to effect the alignment for each chip, the chip arrangement is calculated to minimize the positional error, and the stepping of the wafer W is effected on the basis of the calculated result. In this case, by detecting the plurality of marks and by averaging the images, the measuring ability is improved. The present invention can be applied to these systems.

Now, a method for detecting the position of the wafer mark by imaging both the index pattern AM (refer to FIG. 5) and the wafer alignment mark WM1 by plural times by means of the off-axis alignment system AL1 of the projection exposure apparatus of FIG. 4 will be explained.

Figure 5C:
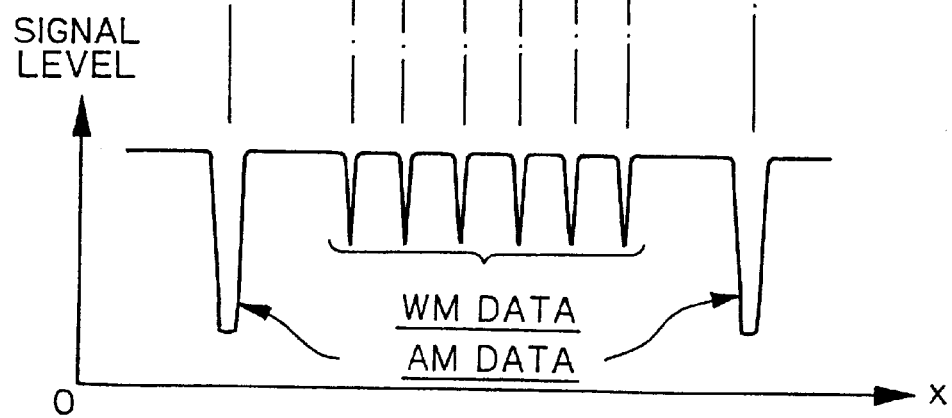
FIG. 5C is a view showing a signal from an imaging element.

When the index pattern on the index plate 206 and the alignment mark WM1 on the wafer W are imaged by the off-axis alignment system AL1, a wave form of the alignment signal obtained by the imaging element S1 becomes as shown in FIG. 5C. From the pinching type index pattern AM and the wafer alignment mark WM1 (line-and-space pattern) on the imaging element S1, the signal having the wave form shown in FIG. 5C is obtained. By seeking the positions of the index plate and the position of the wafer mark by means of an edge slicing method by using this signal, the position of the wafer mark WM1 with respect to the pattern AM on the index plate 206 can be determined.

Next, the plural times of samplings of the wafer mark and the index pattern will be explained with reference to FIG. 6. FIG. 6A is a graph showing an output timing of a light emitting trigger signal for emitting the light from the alignment light source 205, and FIG. 6B is a graph showing change in position of the wafer stage in the alignment direction.

In the illustrated embodiment, the positioning allowable area for allowing the light emission of the alignment light source 205 is relatively broad and is set to about 100–150 nm, for example. In a positioning mode, when it is detected that the position of the wafer mark is brought into a predetermined allowable area range relative to an origin position (reference position) O (FIG. 6B) corresponding to the design position, the servo control is effected for making the reference position as a target.

At a time t0 in FIG. 6A, when the position of the wafer stage is brought into the allowable area range, the main control system 300 resets the pixels of the imaging elements S1, and, thereafter, at a time t1, the light emitting trigger signal is sent to the alignment light source 205. The alignment light source 205 is energized by the light emitting trigger signal to emit the light which is in turn illuminated onto the alignment mark WM1 on the wafer W through the alignment system AL1. The imaging element S1 receives the reflected light from the mark WM1 and accumulates it until a reset signal is supplied. Since the interval of light emission is about 20 msec, the charge is sufficiently accumulated. The position x1 of the wafer stage 105 in the measuring direction upon emission of light is detected by the interferometers 107.

Then, the main control system 300 reads the image data GD1 shown in FIG. 6C from the imaging element S1, thereby resetting the pixels. At a time t2, when the next light emitting trigger signal is emitted, the alignment light source 205 is energized to emit the light which is in turn illuminated onto the alignment mark WM1 on the wafer W through the alignment system AL1. The imaging element S1 receives the mark image and accumulates the charge. The position x2 of the wafer stage 105 in the measuring direction upon emission of light is detected. The main control system 300 reads the image data GD2 (FIG. 6C) from the imaging element S1, thereby resetting the pixels. Further, at a time t3, when the next light emitting trigger signal is emitted, the alignment light source 205 is energized to emit the light and the imaging element S1 receives the mark image and accumulates the charge. The position x3 of the wafer stage 105 in the measuring direction upon emission of light is detected. The main control system 300 reads the image data GD3 (FIG. 6C) from the imaging element S1. The similar operation is repeated until the image data corresponding to predetermined pulses (for example, five images) is obtained.

FIG. 6D shows signal data (image data) of the single image by using the pulse lights. Although the interval of light emission is about 20 msec, since the wafer stage 105 is being shifted, the respective image data are deviated in the measuring direction (x direction) by a small amount corresponding to the product of the shifting speed of the wafer stage 105 and the the interval of light emission. FIG. 6C is an enlarged view of a portion "a" in FIG. 6D. As shown, edges of the image data GD1, GD2, GD3 are deviated in the measuring direction.

The plurality of image data GD1, GD2, GD3, . . . , GDn are corrected on the basis of the positional information of the wafer stage 105 corresponding to the respective pulses and then are added, thereby composing the final positioning data with no blur. When the resolving power of the pixels is great and a length per pixel is sufficiently short in comparison with the desired alignment accuracy, the image data may be deviated by (amounts corresponding to) the number of pixels corresponding to the positional deviations for the respective pulses and then added.

However, normally, since the length of the wafer marks in the measuring direction is several tens of μm (in total), the visual field of the imaging element becomes about 100 μm on the wafer W. When it is assumed that the number of pixels of the imaging element is 1024 channels (pixels), the length of one pixel becomes 100 nm or less, which is considerably greater than 10–20 nm (i.e., desired accuracy) and approximates to the positioning allowable area range for the alignment. In such a case, it is preferable that, after primary or secondary interpolation between the adjacent pixels is effected, the addition is made.

Figures 7A, 7B:
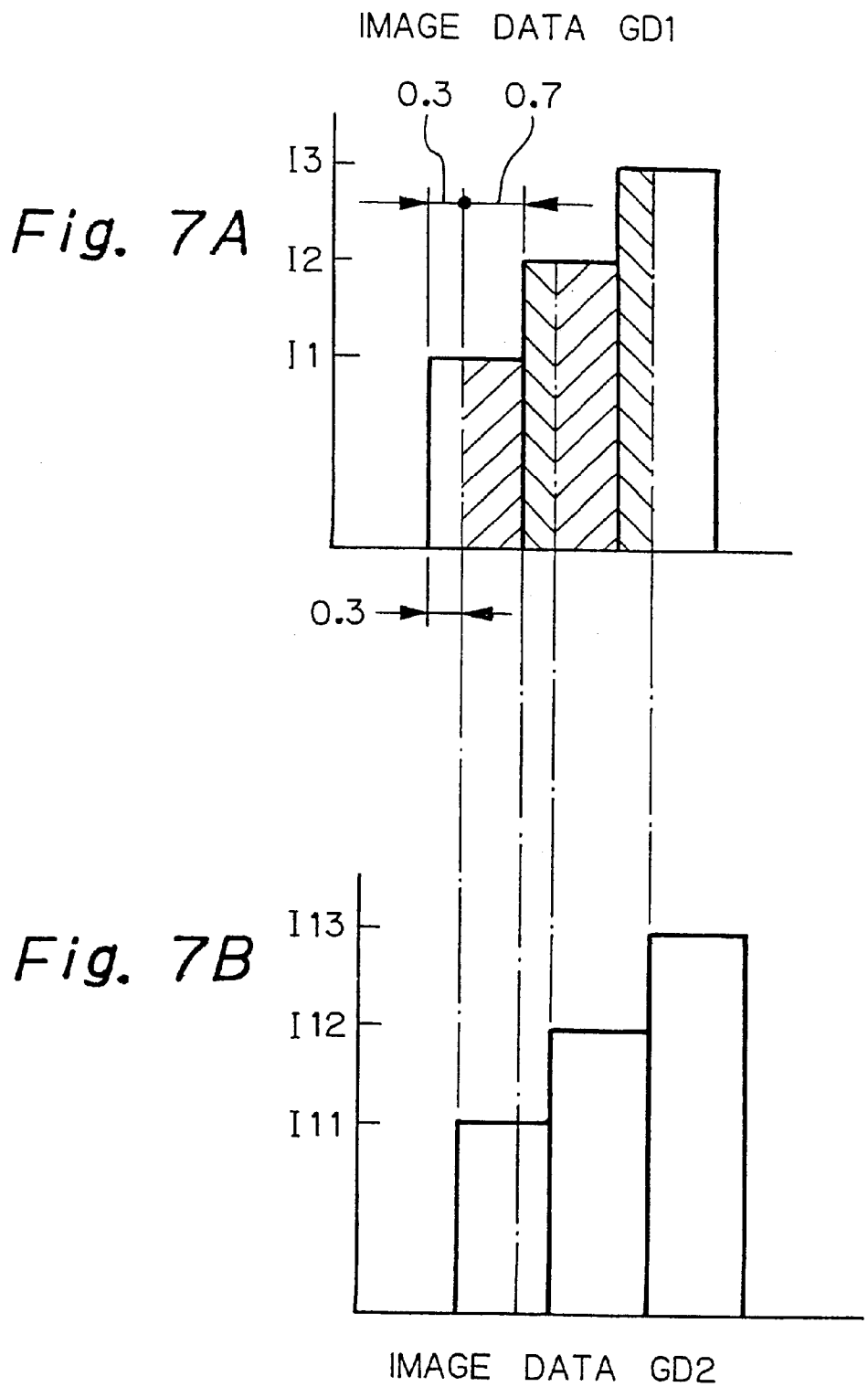
FIGS. 7A and 7B are views for explaining addition of image data.

For example, FIGS. 7A and 7B show wave forms of signals for first to third channels of the image data GD1, GD2 and show a condition that the wafer stage 105 is shifted by an amount (pixel width×0.3) between a time t1 and a time t2. In this case, data obtained after the pixels of the image data GD1, GD2 are composed by primary interpolation with a reference of GD2 can be represented as follows regarding the first and second pixels:

$$GDT1 = I_{11} + (0.7 \times I_1 + 0.3 \times I_2)$$

$$GDT2 = I_{12} + (0.7 \times I_2 + 0.3 \times I_3)$$

where, GDT1 is image data of the first pixel after composition, GDT2 is image data of the second pixel after composition, $I_1$ is intensity of the signal of the first pixel of the image data GD1, $I_2$ is intensity of the signal of the second pixel of the image data GD1, $I_3$ is intensity of the signal of the third pixel of the image data GD1, $I_{11}$ is intensity of the signal of the first pixel of the image data GD2, and $I_{12}$ is intensity of the signal of the second pixel of the image data GD2.

That is to say, in the position detecting apparatus according to the illustrated embodiment, the sampling of the plural image data is effected by imaging both the wafer mark and the index pattern by plural times in synchronous with the emission of pulse and the position of the stage upon each sampling is measured, and the plural image data are composed in consideration of the shift amount of the wafer stage 105. Incidentally, such image composition can be performed by the main control system 300 or an exclusive image processing circuit.

As mentioned above, according to the illustrated embodiment, since the light source of pulse generating type is used, it can be assumed that the wafer stage 105 is substantially kept stationary within the pulse emitting time period, and, thus, the position detecting accuracy is not affected by undesired influence due to the blurred image caused by the shifting of the stage. That is to say, even when the discharge tube is used as the light source and the flashing time period is selected to 10 μsec and the speed of the wafer stage 105 is selected to 100 μm/sec, the deviation of the mark image becomes merely 1 nm. Further, when the position is detected, the accurate positioning is not required. That is, after rough positioning is effected, i.e., after it is detected that the position is brought into the positioning allowable area range of about 100–150 nm, the image data can be obtained even when the wafer stage 105 is not completely stopped but is shifting minutely, thereby reducing the total alignment time period and improving the through-put.

Further, although the respective image data are deviated in the measuring direction as the wafer stage 105 is shifted, since the addition is effected while deviating the pixels and the addition treatment is effected by the primary or secondary interpolation, the occurrence of the blurred image due to the addition treatment can be suppressed to the minimum, and, thus, the desired position detecting accuracy can be achieved even when the position of the wafer mark is detected by imaging both the wafer mark and the index pattern by several times while shifting the wafer stage 105.

Since the position data is obtained simultaneously with the image data, when the good measuring ability can be achieved by the single measurement, it is not required that the plural data are used.

Also in the second alignment system AL2, the alignment time period can be reduced by obtaining the image data in the same manner as the first alignment system AL1.

While an example that the exposure apparatus has the projection optical system was explained, the present invention is not limited to such an example, but can be applied to alignment of an exposure apparatus of proximity type. Further, in place of the discharge tube or the pulse laser, a light source of continuous light emitting type may be used and, in this case, pulse light may be generated by using a shutter. The similar position detection may be performed by using the alignment system AL2 of TTR type. In addition, the present invention can be applied to an X-ray projection exposure apparatus or a projection exposure apparatus utilizing a charge particle ray such as a electron beam.

Regarding the correspondence of elements between the above-mentioned embodiment and claims, the light sources 204, 205 corresponds to illumination system, the interferometers 107 correspond to position detecting system, and the main control system 300 corresponds to position memory system, image memory system and image composing system.

Reference is also made to Japanese Patent Application No. 9(1997)-38,328 filed on Feb. 6, 1997 and No. 9(1997)-85,153 filed on Apr. 3, 1997.

What is claimed is:

1. A projection exposure apparatus which transfers a pattern formed on a mask onto a substrate by illuminating the pattern, comprising:

an alignment system which is provided with a light source for emitting a white flashing light and which emits said white flashing light onto an alignment mark provided on said photosensitive substrate and which receives reflected light reflected from the alignment mark to image an image of said alignment mark;

a substrate stage which shifts said photosensitive substrate in a two dimensional plane, said photosensitive substrate being placed on said substrate stage;

a stage position measuring system which obtains information on positions of said substrate stage in synchronization with emission of said white flashing light; and a positioning device, which is electrically connected to said alignment system and said stage position measuring system, and which performs relative positioning operation of between said substrate and said pattern formed on said mask based on a detecting result of the alignment system and a measuring result of the stage position measuring system;

wherein said projection exposure apparatus transfers an image of said pattern formed on said mask onto said substrate by illuminating the pattern formed on the mask after said relative positioning operations by said positioning device.

2. A projection exposure apparatus according to claim 1, wherein a timing for emitting the flashing light is in synchronous with a measuring timing of said stage position measuring system.

3. A projection exposure apparatus according to claim 2, wherein the flashing light is emitted by several times, and respective positions of said substrate stage upon emission of the respective flashing lights are measured by said stage position measuring system, and a plurality of detected images of the alignment mark are averaged.

4. A projection exposure apparatus for projecting a pattern on a mask to a photosensitive substrate comprising:

a position detecting illumination system which emits pulse light onto an alignment mark on a substrate placed on a stage;

an imaging element which images an image of the alignment mark in synchronization with emission of the pulse light;

a position detecting system which reads a position of said stage on which said substrate is placed, in synchronization with emission of the pulse light;

a position memory system which stores the position of said stage read by said position detecting system; and an image memory system which stores image data imaged by said imaging element.

5. A projection exposure apparatus according to claim 4, further comprising an image composing system which forms a composite image on the basis of the plurality of image data stored in said image memory system and the position data corresponding to the plurality of image data stored in said position memory system.

6. A projection exposure apparatus according to claim 5, wherein, when signals of respective pixels of said imaging element are added to each other with respect to the plurality of image data, said image composing system corrects the signals of respective pixels by shift amounts of said stage detected by said position detecting system at respective imaging points and adds the corrected data to each other.

7. A projection exposure apparatus according to claim 4, wherein the mark is imaged by said imaging element by plural times while shifting said stage.

8. A method of operating a projection exposure apparatus for projecting a pattern on a mask to a photosensitive substrate, said method comprising:

an illuminating step for emitting pulse light onto a mark on said substrate placed on a stage;

an imaging step for imaging an image of the mark in synchronization with emission of the pulse light;

a position detecting step for reading a position of said stage in synchronization with emission of the pulse light;

a position storing step for storing the position of said stage read by said position detecting step; and an image storing step for storing image data so imaged.

9. A method of operating a projection exposure apparatus according to claim 8, further comprising an image composing step for forming a composite image on the basis of the plurality of the image data stored in said image storing step and the position data corresponding to the plurality of image data stored in said position storing step.

10. A method of operating a projection exposure apparatus according to claim 9, wherein, when signals of respective pixels of said imaging element are added to each other with respect to the plurality of image data, said image composing step corrects the signals of respective pixels by shift amounts of said stage detected at respective imaging points and adds the corrected data to each other.

11. A method of operating a projection exposure apparatus according to claim 8, wherein said imaging step images the mark by plural times in synchronization with the emission of the pulse light while shifting said stage.

12. A projection exposure apparatus according to claim 1, wherein said projection exposure apparatus further comprises:

a projection optical system which projects an image of a pattern on said mask illuminated by exposure light onto said photosensitive substrate.

13. A projection exposure apparatus according to claim 1, wherein the flashing light is emitted by several times, respective positions of said substrate stage upon emission of the respective flashing lights are measured by said stage position measuring system, and a plurality of detected images of the alignment mark are averaged.

14. A projection exposure apparatus according to claim 1, wherein said alignment system includes an off-axis type alignment system.

15. A projection exposure apparatus according to claim 14, wherein said alignment system includes an imaging means which images said alignment mark, and wherein an image information imaged by said imaging means is processed to detect a position of said alignment mark.

16. A projection exposure apparatus according to claim 1, including a stepper type projection exposure apparatus which projects said pattern onto said substrate under the condition that said mask and said substrate are stationary.

17. A projection exposure apparatus according to claim 1, including a scanning type projection exposure apparatus in which said substrate is exposed in a scanning manner in synchronization with the relative movement between said mask and said substrate.

18. A method of operating projection exposure by using a projection exposure apparatus for projecting a pattern on a mask to a photosensitive substrate comprising steps of;

emitting a white flashing light to an alignment mark provided on a substrate;

receiving reflected light reflected from the alignment mark to image an image of the alignment mark;

measuring information on a substrate stage which shifts said substrate in a two-dimensional plane in synchronization with emission of said white flashing light, said substrate being placed on said substrate stage;

aligning said substrate based on a result of detecting of the alignment mark; and projecting said pattern onto said substrate after finishing said aligning.

19. A method of operating projection exposure according to claim 18, wherein said projection exposure apparatus further comprises:

a projection optical system which projects an image of a pattern on said mask illuminated by exposure light onto said photosensitive substrate.

20. A method of operating projection exposure according to claim 18, wherein the flashing light is emitted by several times, respective positions of said substrate stage upon emission of the respective flashing lights are measured by said substrate stage information measuring step, and a plurality of detected images of the alignment mark are averaged.

21. A method of operating projection exposure according to claim 18, wherein said alignment system includes an off-axis type alignment system.

22. A method of operating projection exposure according to claim 21, wherein said alignment system includes an imaging means which images said alignment mark, and wherein an image information imaged by said imaging means is processed to detect a position of said alignment mark.

23. A method of operating projection exposure according to claim 18, said projection exposure apparatus including a stepper type projection exposure apparatus which projects said pattern onto said substrate under the condition that said mask and said substrate are stationary.

24. A method of operating projection exposure according to claim 18, said projection exposure apparatus including a scanning type projection exposure apparatus in which said substrate is exposed in a scanning manner in synchronization with the relative movement between said mask and said substrate.

25. A projection exposure apparatus according to claim 4, wherein said pulse light is operated from a pulse light source which emits pulse light.

26. A projection exposure apparatus according to claim 4, wherein said pulse light is created by a continuous light generated from a source which emits a successive light.

27. A projection exposure apparatus according to claim 26, wherein said pulse light is created by an operation of a shutter which is capable of open or close a light path of said continuous light.

28. A projection exposure apparatus according to claim 4, wherein said position detecting system includes an off-axis type detection system.

29. A projection exposure apparatus according to claim 4, wherein said position detecting system includes a system which emits said pulse light onto said substrate through said mask.

30. A projection exposure apparatus according to claim 4, wherein said projection exposure apparatus includes a projection optical system which projection said pattern onto said substrate.

31. A method of operating projection exposure according to claim 8, wherein said pulse light is generated from a pulse light source which emits pulse light.

32. A method of operating projection exposure according to claim 8, wherein said pulse light is created by a continuous light generated from a source which emits a successive light.

33. A method of operating projection exposure according to claim 32, wherein said pulse light is created by an operation of a shutter which is capable of open or close a light path of said continuous light.

34. A method of operating projection exposure according to claim 8, wherein said position detecting step includes a step of an off-axis type detection.

35. A method of operating projection exposure according to claim 8, wherein said position detecting step includes a step of emitting said pulse light onto said substrate through said mask.

36. A method of operating projection exposure according to claim 8, wherein said projection exposure apparatus includes a projection optical system which projects said pattern onto said substrate.

* * * * *